(12) United States Patent
Wang et al.

(10) Patent No.: US 12,113,060 B2
(45) Date of Patent: Oct. 8, 2024

(54) DISPLAY SUBSTRATE AND PREPARATION METHOD THEREOF, AND DISPLAY APPARATUS

(71) Applicants: Beijing BOE Display Technology Co., Ltd., Beijing (CN); BOE Technology Group Co., Ltd., Beijing (CN)

(72) Inventors: Tingting Wang, Beijing (CN); Yan Yan, Beijing (CN); Qi Wang, Beijing (CN); Li Tian, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 435 days.

(21) Appl. No.: 17/424,900

(22) PCT Filed: Oct. 28, 2020

(86) PCT No.: PCT/CN2020/124203
§ 371 (c)(1),
(2) Date: Jul. 22, 2021

(87) PCT Pub. No.: WO2022/087861
PCT Pub. Date: May 5, 2022

(65) Prior Publication Data
US 2022/0320078 A1 Oct. 6, 2022

(51) Int. Cl.
*H01L 27/02* (2006.01)
*G02F 1/1368* (2006.01)
(Continued)

(52) U.S. Cl.
CPC ........ *H01L 27/0296* (2013.01); *G02F 1/1368* (2013.01); *H01L 27/124* (2013.01);
(Continued)

(58) Field of Classification Search
CPC ..... G02F 1/1368; G09G 3/36; H01L 27/0288; H01L 27/0296; H01L 27/124;
(Continued)

(56) References Cited

U.S. PATENT DOCUMENTS

2015/0380349 A1 12/2015 Yan
2021/0366338 A1 11/2021 Xi

FOREIGN PATENT DOCUMENTS

CN 203085140 U 7/2013
CN 103927961 A 7/2014
(Continued)

OTHER PUBLICATIONS

International Preliminary Report on Patentability for PCT/CN2020/124203, May 2, 2023. (Year: 2023).*

*Primary Examiner* — Julie Anne Watko
(74) *Attorney, Agent, or Firm* — Ling Wu; Stephen Yang; Li and Yang Intellectual Property

(57) ABSTRACT

Provided is a display substrate including a substrate, wherein the substrate includes a display region and a peripheral region located at the periphery of the display region. A GOA circuit, a first common electrode lead, a first capacitor and at least one first ESD unit are provided in the peripheral region. The GOA circuit includes a plurality of GOA units and STV signal lines electrically connected to at least one GOA unit. The first common electrode lead is connected to the STV signal line through at least one first ESD unit. A first capacitor electrode of the first capacitor is connected to the STV signal line, and a second capacitor electrode of the first capacitor is connected to the first common electrode lead.

11 Claims, 4 Drawing Sheets

(51) Int. Cl.
  *H01L 27/12*  (2006.01)
  *H01R 13/703*  (2006.01)
  *H05K 1/02*  (2006.01)
  *G09G 3/36*  (2006.01)

(52) U.S. Cl.
  CPC ...... *H01L 27/1244* (2013.01); *H01L 27/1255* (2013.01); *H01R 13/7031* (2013.01); *H05K 1/0259* (2013.01); *G09G 3/36* (2013.01); *H01L 27/0288* (2013.01)

(58) Field of Classification Search
  CPC ............ H01L 27/1244; H01L 27/1255; H01R 13/7031; H05K 1/0259
  See application file for complete search history.

(56) References Cited

FOREIGN PATENT DOCUMENTS

| | | |
|---|---|---|
| CN | 104090436 A | 10/2014 |
| CN | 110930921 A | 3/2020 |
| CN | 111223456 A | 6/2020 |
| CN | 111430375 A | 7/2020 |
| JP | 3-132723 A | 6/1991 |
| KR | 2001-0058156 A | 7/2001 |

\* cited by examiner

DISPLAY SUBSTRATE AND PREPARATION METHOD THEREOF, AND DISPLAY APPARATUS

TECHNICAL FIELD

The present disclosure relates to, but is not limited to, the field of display technology, in particular to a display substrate and method for preparing the display substrate, and a display apparatus.

BACKGROUND

Gate driver on array (GOA) technology integrates a gate driver on an array substrate to form scanning drive for panel, which improves the integration of display panel and reduces the utilization rate of integrated circuit (IC) driven by a gate electrode, and thus is widely used. However, due to the high density of metal in the GOA circuit, it is easy to accumulate a large amount of electric charges, causing defect of electro-static discharge (ESD), which easily leads to electro-static penetration of the GOA unit and short circuit of the GOA unit. This undermines the proper functioning of the GOA, and reduces the product yield of the GOA circuit.

SUMMARY

The following is a summary of subject matter described in detail herein. This summary is not intended to limit the protection scope of the claims.

Embodiments of the present disclosure provide a display substrate, a method for preparing the display substrate, and a display apparatus.

In one aspect, the present disclosure provides a display substrate including a substrate, wherein the substrate includes a display region and a peripheral region located at the periphery of the display region. The peripheral region is provided with a gate driver on array (GOA) circuit, a first common electrode lead, a first capacitor and at least one first electro-static discharge (ESD) unit. The GOA circuit includes a plurality of GOA units and STV signal lines electrically connected to at least one GOA unit; the first common electrode lead is connected to the STV signal line through the at least one first ESD unit. A first capacitor electrode of the first capacitor is connected to the STV signal line, and a second capacitor electrode of the first capacitor is connected to the first common electrode lead.

In some exemplary embodiments, the peripheral region is further provided with a second common electrode lead, which is in the same layer structure as the STV signal line, the first common electrode lead is located on a side of the second common electrode lead away from the substrate, and the first common electrode lead is electrically connected to the second common electrode lead.

In some exemplary embodiments, the peripheral region is further provided with a ground lead and a second ESD unit, and the second common electrode lead is connected to the ground lead through the second ESD unit.

In some exemplary embodiments, the first capacitor electrode of the first capacitor and the STV signal line have an integral structure.

In some exemplary embodiments, the second capacitor electrode of the first capacitor is S-shaped.

In some exemplary embodiments, the first common electrode lead and the pixel electrode of the display region are of the same layer structure.

In some exemplary embodiments, the STV signal line includes a first part, a second part and a switching unit connected between the first part and the second part. The switching unit includes a first switching electrode, a second switching electrode and a third switching electrode; the second switching electrode connects the first switching electrode and the first part, and the third switching electrode connects the first switching electrode and the second part. The first part and the second part are of the same layer structure, and the second switching electrode and the third switching electrode are of the same layer structure; the first switching electrode is located on a side of the first and second parts away from the substrate, and the second and third switching electrodes are located on a side of the first switching electrode away from the substrate.

In some exemplary embodiments, the second switching electrode and the third switching electrode are of the same layer structure as the pixel electrode of the display region.

In some exemplary embodiments, a first part of the STV signal line is connected to a first capacitor electrode of the first capacitor, and a second part of the STV signal line is connected to the at least one GOA unit; or, the second part of the STV signal line is connected to the first capacitor electrode of the first capacitor and the at least one GOA unit.

In some exemplary embodiments, the first ESD unit includes a base electrode layer disposed on a substrate, a first insulator layer covering the base electrode layer, an bonding electrode layer disposed on the first insulator layer, a second insulator layer covering the bonding electrode layer, and a connection electrode layer disposed on the second insulator layer. The basic electrode layer includes a first basic electrode, a second basic electrode and a third basic electrode which are disposed on the substrate. The bonding electrode layer includes a first bonding electrode, a second bonding electrode, a third bonding electrode and a fourth bonding electrode which are disposed on the first insulator layer. The connection electrode layer includes a first connection electrode, a second connection electrode, a third connection electrode and a fourth connection electrode which are disposed on the second insulator layer. The first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode. A first semiconductor region is disposed between the first bonding electrode and the second bonding electrode, and a second semiconductor region is disposed between the third bonding electrode and the fourth bonding electrode. The first connection electrode is connected to the first common electrode lead or the STV signal line, and the fourth connection electrodes of two adjacent first ESD units are connected through ESD connection lines.

In another aspect, an embodiment of the present disclosure provides a display apparatus, which includes the display substrate described above.

In another aspect, an embodiment of the disclosure provides a method for preparing a display substrate, which includes the following steps: forming a GOA circuit, a first common electrode lead, a first capacitor and at least one first ESD unit in the peripheral region of the substrate. The GOA circuit includes a plurality of GOA units and STV signal lines electrically connected to at least one GOA unit; the first common electrode lead is connected to the STV signal line through the at least one first ESD unit. A first capacitor electrode of the first capacitor is connected to the STV signal line, and a second capacitor electrode of the first capacitor is connected to the first common electrode lead.

In some exemplary embodiments, the forming of the GOA circuit, the first common electrode lead, the first capacitor and at least one ESD unit in the peripheral region of the substrate includes: forming a first insulator layer in the peripheral region of the substrate; sequentially forming a first insulator layer, a semiconductor layer and a second conductive layer on a side of the first conductive layer away from the substrate; sequentially forming a second insulator layer and a third conductive layer on a side of the second conductive layer away from the substrate. The first conductive layer at least includes an STV signal line, a first capacitor electrode of a first capacitor, a gate electrode of a transistor of an GOA circuit, and a basic electrode layer of a first ESD unit; the base electrode layer at least includes a first base electrode, a second base electrode and a third base electrode; The semiconductor layer at least includes an active layer of a transistor of a GOA circuit, a first semiconductor region and a second semiconductor region of a first ESD unit; the second conductive layer at least includes: a source-drain electrode of the transistors of the GIA circuit, and a bonding electrode layer of the first ESD unit; and the connection electrode layer at least includes a first bonding electrode, a second bonding electrode, a third bonding electrode and a fourth bonding electrode. The third conductive layer at least includes a first common electrode lead, a second capacitor electrode of a first capacitor and a connection electrode layer of a first ESD unit; and the connection electrode layer at least includes a first connection electrode, a second connection electrode, a third connection electrode and a fourth connection electrode. The first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode; A first semiconductor region is disposed between the first bonding electrode and the second bonding electrode, and a second semiconductor region is disposed between the third bonding electrode and the fourth bonding electrode.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
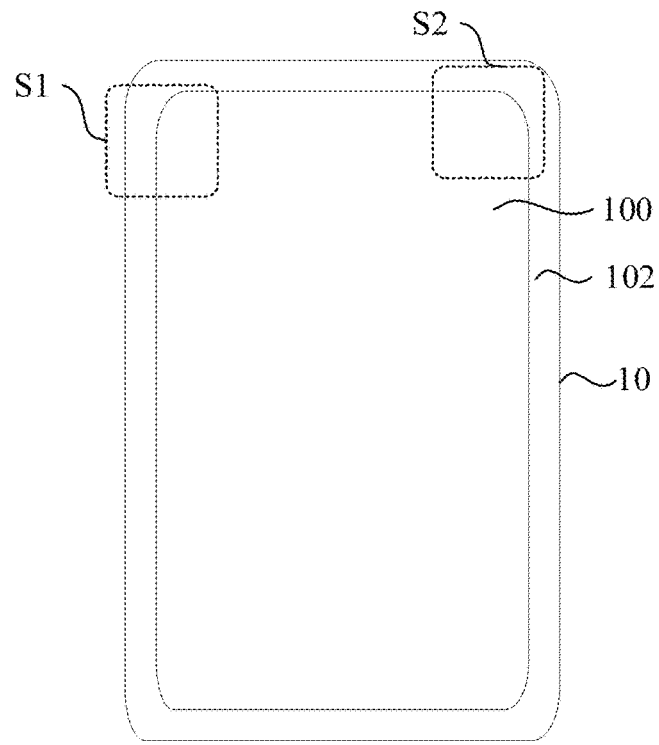
FIG. 1 is a schematic diagram of a display substrate according to at least one embodiment of the present disclosure.

To make the objects, technical solutions and advantages of the present disclosure more clear, embodiments of the present disclosure will be described in detail below with reference to the drawings. The embodiments may be implemented in a number of different forms. Those of ordinary skills in the art will readily understand the fact that implementations and contents may be transformed into one or more of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, size of one or more constituent elements, or thickness or area of a layer, is sometimes exaggerated for clarity. Therefore, an embodiment of the present disclosure is not necessarily limited to the size, and shapes and dimensions of a plurality of components in the drawings do not reflect real scales. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the description of the present disclosure, "a plurality of" means two or more counts.

In the present disclosure, for the sake of convenience, wordings such as "central", "upper", "lower", "front", "rear", "vertical", "horizontal", "top", "bottom", "inner", "outer" and the others describing the orientations or positional relations are used to depict relations of elements with reference to the drawings, which are only for an easy and simplified description of the present disclosure, rather than for indicating or implying that the device or element referred to must have a specific orientation, or must be constructed and operated in a particular orientation and therefore, those wordings cannot be construed as limitations on the present disclosure. The positional relations of the constituent elements may be appropriately changed according to the direction in which constituent elements are described. Therefore, the wordings are not limited in the specification, and may be replaced appropriately according to situations.

In the present disclosure, the terms "installed", "connected" and "coupled" shall be understood in their broadest sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to situations.

In the present disclosure, a transistor refers to an element including at least three terminals, namely, a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. Functions of the "source electrode" and the "drain electrode" are sometimes interchangeable in a case where transistors with opposite polarities are used or in a case where the current direction changes during circuit operation. Therefore, in the present disclosure, "the source electrode" and "the drain electrode" are interchangeable.

In the present disclosure, "an electrical connection" includes a case where constituent elements are connected via an element having a certain electrical action. The "element with a certain electric action" is not particularly limited as long as it can transmit and receive electrical signals between the connected constituent elements. Examples of the "element having a certain electrical action" not only include electrodes and wirings, but also include switching elements such as transistors, resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes "conductive layer" may be replaced by "conductive film". Similarly, "insulator film" may sometimes be replaced by "insulator layer".

At least one embodiment of the present disclosure provides a display substrate, including a substrate. The substrate includes a display region and a peripheral region located at the periphery of the display region. A GOA circuit, a first common electrode lead, a first capacitor and at least one first ESD unit are provided in the peripheral region. The GOA circuit includes a plurality of GOA units and start vertical (STV) signal lines electrically connected to at least one GOA unit. The first common electrode lead is connected to the STV signal line through at least one first ESD unit. A first capacitor electrode of the first capacitor is connected to the STV signal line, and a second capacitor electrode of the first capacitor is connected to the first common electrode lead.

In the display substrate provided by the embodiment of the disclosure, the first capacitor is configured to be connected to the STV signal line and the first common electrode lead, so that when a large amount of static electricity enters from the outside through the STV signal line, the first capacitor can guide a large amount of charge, lead the static electricity out through the first common electrode lead, and reduce the short circuit of the GOA unit caused by ESD, thereby improving the product yield of the GOA circuit. Furthermore, the first common electrode lead and the STV signal line can also achieve electro-static discharge through the first ESD unit.

In some exemplary embodiments, the peripheral region is further provided with a second common electrode lead, which is in the same layer structure as the STV signal line, the first common electrode lead is located on a side of the second common electrode lead away from the substrate, and the first common electrode lead is electrically connected to the second common electrode lead.

In some exemplary embodiments, the peripheral region is further provided with a ground lead (GND) and a second ESD unit. And the second common electrode lead is connected to the ground lead through the second ESD unit. In the present exemplary embodiment, static electricity on the STV signal line may be discharged through the second ESD unit and the ground lead via the first common electrode lead and the second common electrode lead.

In some exemplary embodiments, the first capacitor electrode of the first capacitor and the STV signal line have an integral structure. However, this is not limited in the present embodiment.

In some exemplary embodiments, the first common electrode lead and the pixel electrode of the display region are of the same layer structure. Since the surface resistance of the thin film layer where the pixel electrode is located is relatively large, static electricity can be led out through the first common electrode lead by a first common electrode lead, which is disposed in the same layer as the pixel electrode, thus preventing the STV signal line from being destroyed by static electricity.

In some exemplary embodiments, the STV signal line includes a first part, a second part and a switching unit connected between the first part and the second part. The switching unit includes a first switching electrode, a second switching electrode and a third switching electrode. The second switching electrode connects the first switching electrode and the first part, and the third switching electrode connects the first switching electrode and the second part. The first part and the second part are of the same layer structure, and the second switching electrode and the third switching electrode are of the same layer structure. The first switching electrode is located on a side of the first and second parts away from the substrate, and the second and third switching electrodes are located on a side of the first switching electrode away from the substrate.

In some exemplary embodiments, the second connection electrode and the third connection electrode are of the same layer structure as the pixel electrode of the display region. Since the surface resistance of the thin film layer where the pixel electrode is located is relatively large, the first part and the second part of the STV signal line can be switched by using the second connection electrode and the third connection electrode disposed in the same layer as the pixel electrode, which can prevent the STV signal line from being destroyed when a large amount of static electricity passes through, avoiding interfering the STV signal input to the GOA unit.

In some exemplary embodiments, a first part of the STV signal line is connected to a first capacitor electrode of the first capacitor, and a second part of the STV signal line is connected to the at least one GOA unit; or, the second part of the STV signal line is connected to the first capacitor electrode of the first capacitor and the at least one GOA unit. However, this is not limited in the present embodiment.

In some exemplary embodiments, the first ESD unit includes a base electrode layer disposed on a substrate, a first insulator layer covering the base electrode layer, an bonding electrode layer disposed on the first insulator layer, a second insulator layer covering the bonding electrode layer, and a connection electrode layer disposed on the second insulator layer. The basic electrode layer includes a first basic electrode, a second basic electrode and a third basic electrode which are disposed on the substrate. The bonding electrode layer includes a first bonding electrode, a second bonding electrode, a third bonding electrode and a fourth bonding electrode which are disposed on the first insulator layer. The connection electrode layer includes a first connection electrode, a second connection electrode, a third connection electrode and a fourth connection electrode which are disposed on the second insulator layer. The first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode; A first semiconductor region is disposed between the first bonding electrode and the second bonding electrode, and a second semiconductor region is disposed between the third bonding electrode and the fourth bonding electrode. The first connection electrode is connected to the first common electrode lead or the STV signal line, and the fourth connection electrodes of two adjacent first ESD units are connected through ESD connection lines. In some examples, two first ESD units may be connected between the first common electrode lead and the switching unit of the STV signal line, wherein the first connection electrode of one first ESD unit is connected to the first common electrode, and the fourth connection electrode is connected to the ESD connection line; the first connection electrode of the other first ESD unit is connected to the third switching electrode of the switching unit of the STV signal line, and the fourth connection electrode is connected to the ESD connecting line. However, this is not limited in the present embodiment. For example, one first ESD unit or three or more first ESD units may be connected between the first common electrode lead and the switching unit of the STV signal line.

The display substrate according to the present embodiment will be illustrated by some examples below.

FIG. 1 is a schematic diagram of a display substrate according to at least one embodiment of the present disclosure. In an exemplary embodiment, the display substrate of this embodiment may be an LCD array substrate. The LCD display panel may be made by filling a liquid crystal layer between the array substrate and the color filter substrate, which drives the torsion of liquid crystal molecules by an electric field for light to transmit selectively to present images with different gray scales. An electric field that drives the torsion of the liquid crystal molecules is formed between a pixel electrode and a common electrode. In some embodiments, the pixel electrode may be disposed on the array substrate, and the common electrode may be disposed on the color filter substrate. Alternatively, the pixel electrode and the common electrode may both be disposed on the array substrate, for example, the pixel electrode and the common electrode may be arranged in the same layer or in different layers. However, this is not limited in the present embodiment. For example, the display substrate of the presents embodiments may be an OLED display substrate or other types of display substrates.

In an exemplary embodiment, as shown in FIG. 1, the display substrate includes: a substrate including a display region 100 and a non-display region located at the periphery of the display region 100. The non-display region includes a peripheral region 102 surrounding the display region 100 and a bonding region (not shown) on one a of the display region 100. The display region 100 extends around to form a peripheral region 102. In some examples, the display region 100 may be rectangular (e.g., rounded rectangle), and the peripheral region 102 may be a rectangular ring around the display region. However, this is not limited in the present embodiment.

In some exemplary embodiments, the display region 100 is provided with a plurality of gate lines and a plurality of data lines, which can cross to define a plurality of sub-pixel regions, and at least one sub-pixel region is provided with a pixel electrode and a drive circuit connected to the pixel electrode. The drive circuit may include at least one thin film transistor. For example, a drain electrode of the thin film transistor may be electrically connected to the pixel electrode, a source electrode of the thin film transistor may be electrically connected to a data line, and a gate electrode of the thin film transistor may be electrically connected to a gate line. The on/off of the thin film transistor is controlled by a scanning signal transmitted by the gate line, and a pixel voltage transmitted by the data line is output to the pixel electrode through the drive circuit.

In some exemplary embodiments, on a plane perpendicular to the display substrate, the display region 100 may include a substrate, a first conductive layer disposed on the substrate, a first insulator layer covering the first conductive layer, a semiconductor layer and a second conductive layer disposed on the first insulator layer, a second insulator layer covering the semiconductor layer and the second conductive layer, and a third conductive layer disposed on the second insulator layer. The first conductive layer at least includes a gate electrode of the thin film transistor of the drive circuit. The semiconductor layer at least includes the active layer of the thin film transistor of the drive circuit. The second conductive layer at least includes the source-drain electrode of the thin film transistor of the drive circuit. The third conductive layer at least includes a pixel electrode; or, a pixel electrode and a common electrode; or, a common electrode. In some examples, the display region further includes a third insulator layer covering the third conductive layer and a fourth conductive layer disposed on the third insulator layer. The third conductive layer may include a pixel electrode and the fourth conductive layer may include a common electrode; or, the third conductive layer may include a common electrode and the fourth conductive layer may include a pixel electrode. However, this is not limited in the present embodiment.

In some exemplary embodiments, the peripheral region 102 is further provided with a GOA circuit. The GOA circuit may be disposed in peripheral regions 102 on opposite sides of the display region 100. The GOA circuit may supply scanning signals to the gate lines in the display region 100. The bonding region may be provided with devices such as a source drive circuit and a drive control chip. The source drive circuit may supply pixel voltages to the data lines of the display region. The drive control chip may supply control signals to the source drive circuit and the gate drive circuit. However, this is not limited in the present embodiment.

Figure 2:
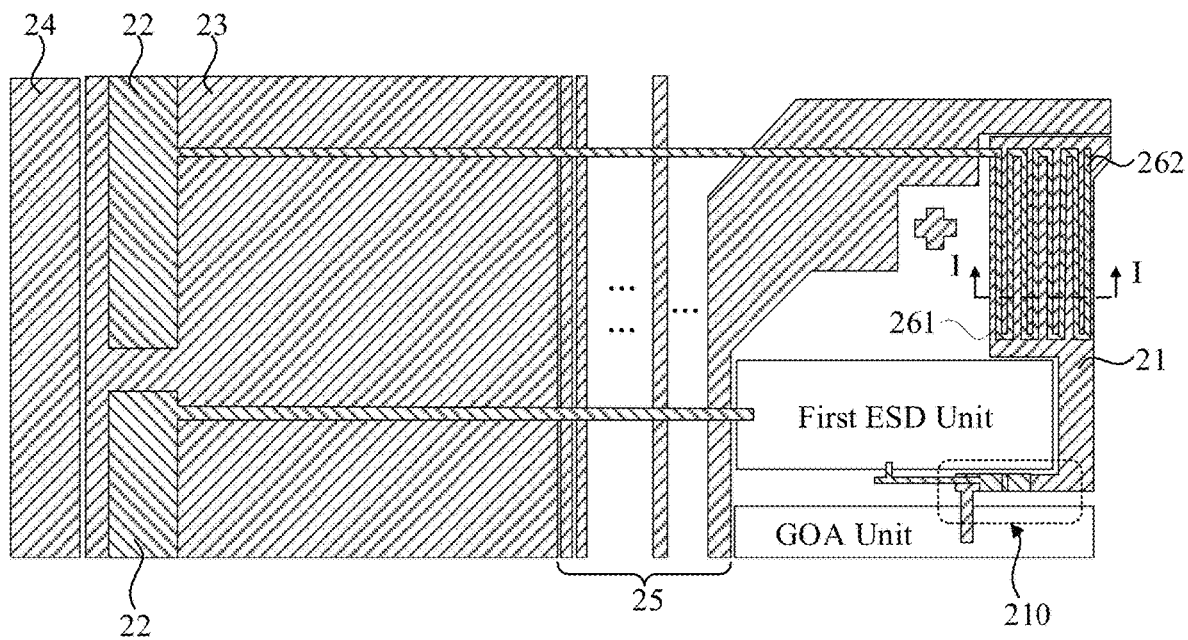
FIG. 2 is an enlarged schematic diagram of the region S1 in FIG. 1.
Figure 3:
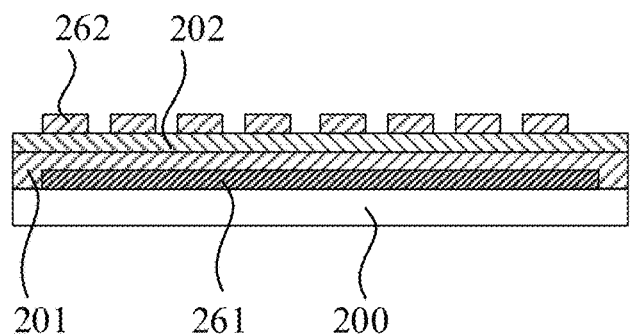
FIG. 3 is a schematic sectional view along a I-I direction in FIG. 2.

FIG. 2 is an enlarged schematic diagram of the region S1 in FIG. 1. FIG. 2 only shows a partial schematic diagram of the peripheral region, and omits the display region. FIG. 3 is a schematic sectional view along a II-II direction in FIG. 2.

In some exemplary embodiments, as shown in FIG. 2, the GOA circuit includes a plurality of GOA units and STV signal lines 21. The STV signal line 21 may be connected to at least one GOA unit. For example, one STV signal line may supply turn-on signals for a plurality of GOA units, or two STV signal lines may supply turn-on signals for two adjacent GOA units respectively.

In some exemplary embodiments, as shown in FIG. 2, the peripheral region is further provided with a first common electrode lead 22, a second common electrode lead 23, a ground lead 24, a signal transmission line group 25, and a first capacitor. The first common electrode lead 22 and the second common electrode lead 23 are arranged in different layers, and the first common electrode lead 22 is connected to the second common electrode lead 23. The projection of the first common electrode lead 22 on the substrate overlaps with the projection of the second common electrode lead 23 on the substrate. An align mark is disposed between the signal transmission line group 25 and the STV signal line 21, and the align mark is, for example, cross-shaped. The ground lead 24 is located on a side of the second common electrode lead 23 away from the display region, and the second common electrode lead 23 is located on a side of the STV signal line 21 away from the display region. The signal transmission line group 25 is located between the second common electrode lead 23 and the STV signal line 21. The ground lead 24, the second common electrode lead 23, the signal transmission line group 25, the STV signal line 21 and the align mark are of the same layer structure. In some examples, the signal transmission line group 25 may include signal lines that supply different signals to the GOA units, which may at least include, for example, a high potential power line (VDD), a low potential power line (e.g., VSS, LVSS), a clock signal line (CLK), and the like. However, this is not limited in the present embodiment.

In some exemplary embodiments, as shown in FIGS. 2 and 3, the second capacitor electrode 262 of the first capacitor is connected to the first common electrode lead 22, and the first capacitor electrode 261 of the first capacitor is connected to the STV signal line 21. Projections of the first capacitor electrode 261 and the second capacitor electrode 262 on the substrate overlap. For example, the first capacitor electrode 261 and the STV signal line 21 have an integral structure, and the second capacitor electrode 262 and the first common electrode 22 have an integral structure. As shown in FIG. 3, a first insulator layer 201 and a second insulator layer 202 are provided between the first capacitor electrode 261 and the second capacitor electrode 262. The second capacitor electrode 262 and the third conductive layer in the display region are of the same layer structure, and the first capacitor electrode 261 and the first conductive layer in the display region are of the same layer structure. In this exemplary embodiment, the surface resistance of the third conductive layer is large, and it is not easy for the static electricity to destroy the third conductive layer. When a large amount of charges are accumulated on the STV signal line, the charges will not be directly released to the GOA unit, causing electro-static penetration to the GOA unit. Instead, a large amount of charges will be guided by the first capacitor, and the static electricity will be led out to the first common electrode lead, thus reducing the risk of static electricity destroying the STV signal line, improving the product yield of the GOA circuit.

In some exemplary embodiments, as shown in FIG. 2, the second capacitor electrode 262 of the first capacitor is S-shaped. The S-shaped first capacitor electrode in this exemplary embodiment can increase the relative area between the first capacitor electrode and the second capacitor electrode, thereby increasing the capacitance of the first capacitor to more effectively discharge the accumulated charge on the STV signal line. However, this is not limited in the present embodiment. For example, the second capacitor electrode of the first capacitor may be rectangular.

Figure 4:
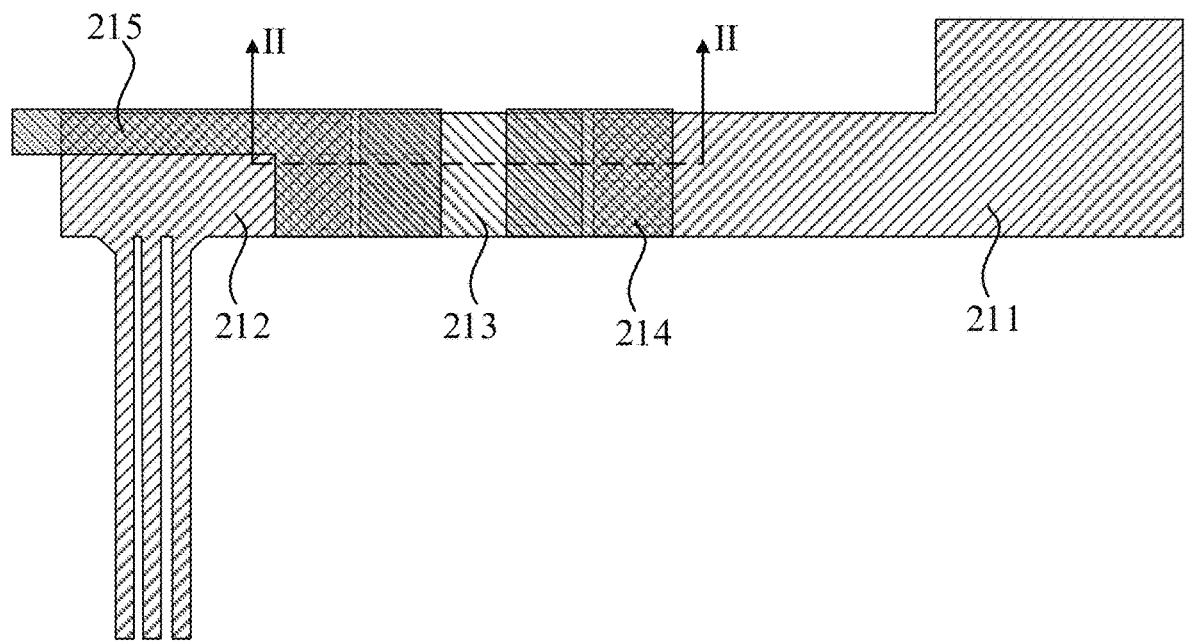
FIG. 4 is an enlarged schematic diagram of a switching unit in FIG. 2.
Figure 5:
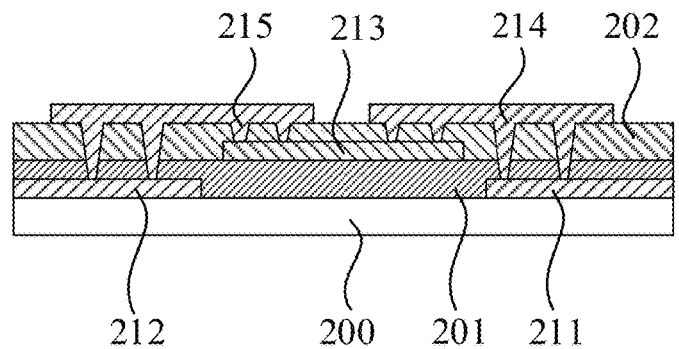
FIG. 5 is a schematic sectional view along a II-II direction in FIG. 4.

In some exemplary embodiments, as shown in FIG. 2, the STV signal line includes a first part, a second part and a switching unit 210 connected between the first part and the second part. The first part is connected to the first capacitor, and the second part is connected to at least one GOA unit. FIG. 4 is an enlarged schematic diagram of a switching unit in FIG. 2. FIG. 5 is a schematic sectional view along a Q-Q I-II direction in FIG. 4. As shown in FIGS. 4 and 5, the switching unit 210 includes a first switching electrode 213, a second switching electrode 214 and a third switching electrode 215. The second switching electrode 214 connects the first switching electrode 213 and the first part 211, and the third switching electrode 215 connects the first switching electrode 213 and the second part 212. The first part 211 and the second part 212 are of the same layer structure, and the second switching electrode 214 and the third switching electrode 215 are of the same layer structure. The first switching electrode 213 is located on a side of the first part 211 and the second part 212 away from the substrate, and the second switching electrode 214 and the third switching electrode 215 are located on a side of the first switching electrode 213 away from the substrate. For example, the first part 211 and the second part 212 are of the same layer structure as the first conductive layer in the display region, the first switching electrode 213 is of the same layer structure as the second conductive layer in the display region, and the second switching electrode 214 and the third switching electrode 215 are of the same layer structure as the third conductive layer in the display region. In this exemplary embodiment, because the surface resistance of the third conductive layer is large, the first part and the second part are bridged by the second switching electrode and the third switching electrode, which can increase the resistance and prevent the STV signal line from being destroyed when a large amount of static electricity passes through.

In some exemplary embodiments, as shown in FIG. 2, at least one first ESD unit is disposed between the signal transmission line group 25 and the STV signal line 21. The first common electrode lead 22 may be connected to the switching unit of the STV signal line 21 through at least one first ESD unit. However, this is not limited in the present embodiment.

Figure 6:
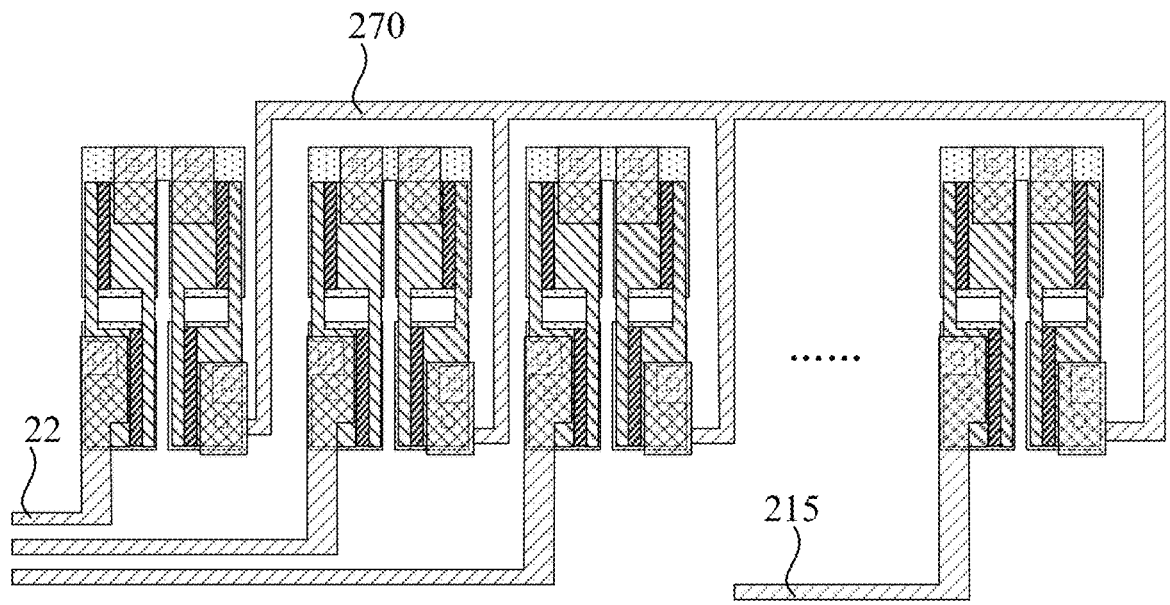
FIG. 6 is a schematic diagram of the structure of a plurality of first ESD units in FIG. 2.
Figure 7:
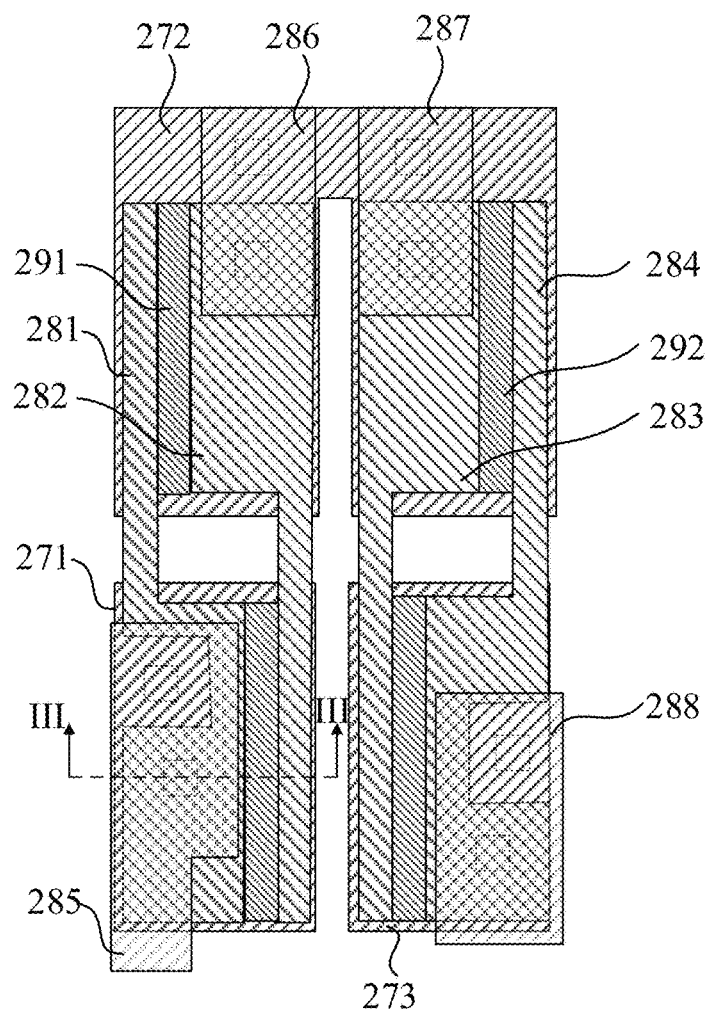
FIG. 7 is a schematic cross-sectional view of a first ESD unit in FIG. 6.
Figure 8:
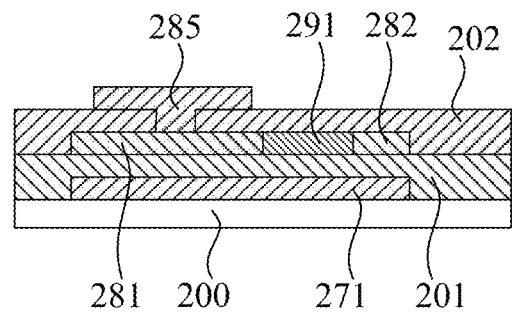
FIG. 8 is a schematic sectional view along an III-III direction in FIG. 7.

FIG. 6 is a schematic diagram of a plurality of first ESD units according to at least one embodiment of the present disclosure. FIG. 7 is a schematic diagram of a first ESD unit in FIG. 6. FIG. 8 is a schematic sectional view along an III-III direction in FIG. 7.

In some exemplary embodiments, as shown in FIGS. 2 and 6, a plurality of interconnected first ESD units are disposed between the signal transmission line group 25 and the STV signal line 21. The plurality of interconnected first ESD units may form an ESD ring. Only four first ESD units are illustrated in FIG. 6. In some examples, as shown in FIG. 6, along a direction away from the display region, the first ESD unit may be connected to the third switching electrode 215 of the switching unit of the STV signal line, the last first ESD unit may be connected to the first common electrode lead 22, the plurality of first ESD units in the middle may be connected to a plurality of signal transmission lines in the signal transmission line group in an one-to-one correspondence, and the adjacent first ESD units may be connected through ESD connection lines 270 to provide static discharge paths for a plurality of signal transmission lines, first common electrode leads and STV signal lines.

In some exemplary embodiments, as shown in FIGS. 7 and 8, the first ESD unit includes a base electrode layer disposed on a substrate, a first insulator layer 201 covering the base electrode layer, an bonding electrode layer disposed on the first insulator layer 201, a second insulator layer 202 covering the bonding electrode layer, and a connection electrode layer disposed on the second insulator layer 202. The basic electrode layer includes a first basic electrode 271, a second basic electrode 272 and a third basic electrode 273 which are disposed on the substrate. The bonding electrode layer includes a first bonding electrode 281, a second bonding electrode 282, a third bonding electrode 283 and a fourth bonding electrode 284 which are disposed on the first insulator layer 201. The connection electrode layer includes a first connection electrode 285, a second connection electrode 286, a third connection electrode and 287 a fourth connection electrode 288 which are disposed on the second insulator layer 202. The first connection electrode 285 is connected to the first base electrode 271 and first bonding electrode 281, the second connection electrode 286 is connected to the second base electrode 272 and second bonding electrode 282, the third connection electrode 287 is connected to the second base electrode 272 and the third bonding electrode 283, and the fourth connection electrode 288 is connected to the third base electrode 273 and fourth bonding electrode 284. A first semiconductor region 291 is disposed between the first bonding electrode 281 and the second bonding electrode 282, and a second semiconductor region 292 is disposed between the third bonding electrode 283 and the fourth bonding electrode 284. In some examples, the basic electrode layer and the first conductive layer in the display region are in the same layer structure, the bonding electrode layer and the second conductive layer in the display region are in the same layer structure, and the first and second semiconductor regions and the semiconductor layers in the display region are in the same layer structure.

In some examples, as shown in FIG. 7, the first base electrode 271 and the third base electrode 273 are located on the same side of the second base electrode 272. The first base electrode 271 and the third base electrode 273 are rectangular, and both terminals of the second base electrode 272 extend toward the first base electrode 271 and the third base electrode 273. The first bonding electrode 281 and the second bonding electrode 282 straddle the first base electrode 271 and second base electrode 272, and the third bonding electrode 283 and the fourth bonding electrode 284 straddle the second base electrode 272 and third base electrodes and 273. The second bonding electrode 282 and the third bonding electrode 283 are both L-shaped composed of a rectangular part and a strip-shaped part. The first bonding electrode 281 and the fourth bonding electrode 284 are each hook-shaped composed of a strip-shaped portion and a rectangular portion with a notch. The first semiconductor region 291 is located between the notched rectangular part of the first bonding electrode 281 and the strip-shaped part of the second bonding electrode 282, and the other first semiconductor region 291 is located between the strip-shaped part of the first bonding electrode 281 and the rectangular part of the second bonding electrode 282. The second semiconductor region 292 is located between the rectangular part of the third bonding electrode 283 and the strip part of the fourth bonding electrode 284, and the other second semiconductor region 292 is located between the strip part of the third bonding electrode 283 and the notched rectangular part of the fourth bonding electrode 284. However, the shapes and arrangement positions of the above electrodes are not limited in the present embodiments.

In some exemplary embodiments, the third switching electrode 215 of the switching unit of the STV signal line connected to the first ESD unit shown in FIG. 7 is taken as an example. The first connection electrode 285 of the first ESD unit is connected to the third switching electrode 215, and the fourth connection electrode 288 is connected to the ESD connection line 270. When the STV signal line generates electric charge, the electric charge will be transferred from the third switching electrode 215 of the switching unit of the STV signal line to the first base electrode 271 and the first bonding electrode 281 through the first connection electrode 285. Since the first bonding electrode 281 and the first base electrode 271 are both connected through the first connection electrode 285, the electric charge will accumulate on the first bonding electrode 281 and the first base electrode 271, effectively improving the dispersion degree of accumulated static electricity. Since the structures of the first bonding electrode 281, the first semiconductor region 291 and the second bonding electrode 282 are similar to the semiconductor discharge tube with overvoltage protection, when the charges on the first bonding electrode 281 are accumulated to a certain extent, static electricity may be released and effectively eliminated by penetrating the first semiconductor region 291 between the first bonding electrode 281 and the second bonding electrode 283. After the first bonding electrode 281 and the second bonding electrode 282 complete static discharge, the third bonding electrode 283 and the fourth bonding electrode 284 may play their role in eliminating static electricity.

Figure 9:
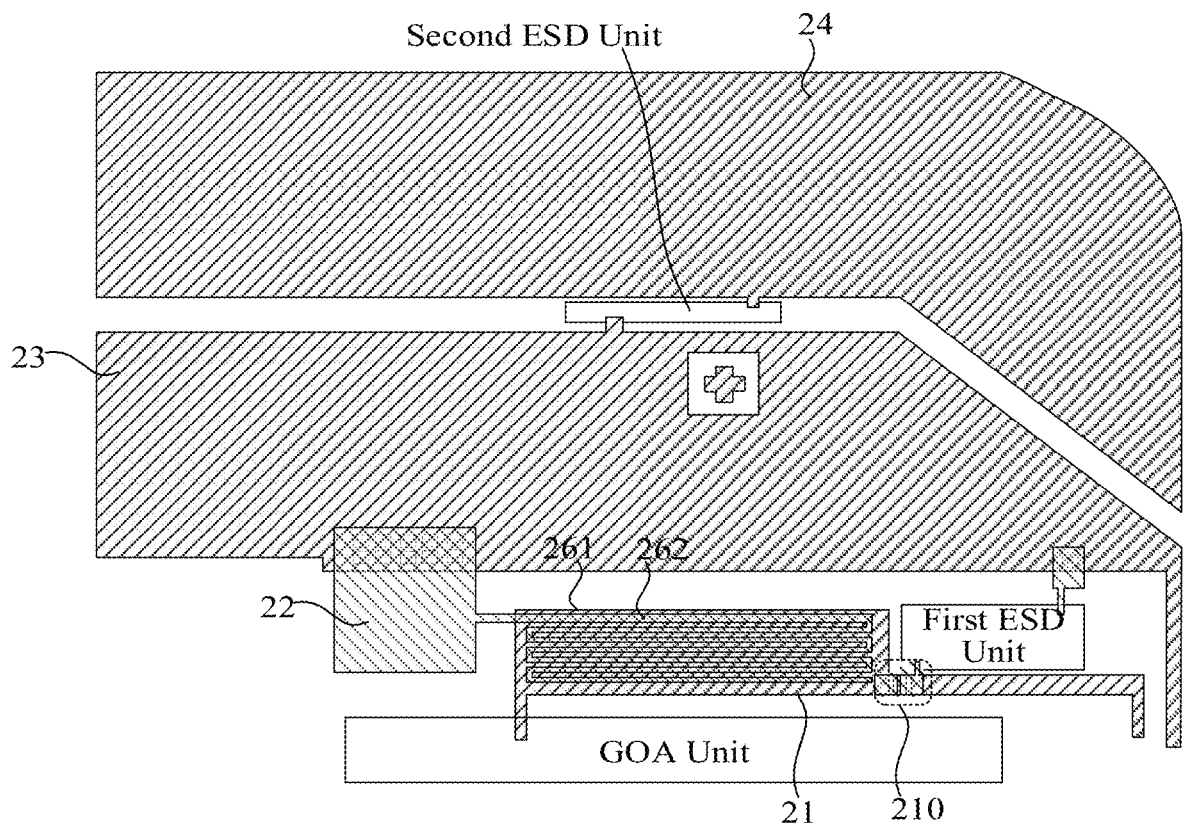
FIG. 9 is an enlarged schematic diagram of the region S2 in FIG. 1.

FIG. 9 is an schematic diagram of the structure of region S2 in FIG. 1. FIG. 9 only shows a partial schematic diagram of the peripheral region. FIGS. 9 and 2 may be partial schematic diagrams of different regions of different display substrates, or may be partial schematic diagrams of different regions of the same display substrate, which is not limited in the present embodiment.

In some exemplary embodiments, as shown in FIG. 9, the ground lead 24 and the second common electrode lead 23 are connected by a second ESD unit. A structure of the second ESD unit may be the same as or similar to that of the first ESD unit. The first connection electrode of the second ESD unit may be connected to the second common electrode lead 23, and the fourth connection electrode may be connected to the ground lead 24. In this example, static electricity on the STV signal line 21 may be conducted to the ground lead 24 through the first capacitor, the first common electrode lead 22, the second common electrode lead 23 and the second ESD unit, thereby reducing the risk of static electricity destroying the STV signal line. However, this is not limited in the present embodiment.

In some exemplary embodiments, the STV signal line 21 includes a first part, a second part, and a switching unit 210 connected between the first part and the second part. A second part of the STV signal line 21 is connected to the first capacitor and at least one GOA unit.

Other structures in FIG. 9 may be referred to the descriptions of the structures shown in FIG. 2 and will not be further illustrated here.

The technical solution of the present embodiment is further illustrated below by an example of a process for preparing a display substrate of the present embodiment. The "patterning process" mentioned in the present embodiment includes processes, such as thin film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured by deposition or coating of a certain material on a substrate base. If a patterning process or a photolithography process is not needed for the "thin film" during the whole manufacturing process, the "thin film" may also be referred to as a "layer". If a patterning process or a photolithography process is needed for the "thin film" during the whole manufacturing process, it is referred to as a "thin film" before the patterning process and referred to as a "layer" after the patterning process. The "layer" after the patterning process or photolithography process includes at least one "pattern".

In the present disclosure, "A and B are arranged on the same layer" means that a and b are formed at the same time by the same patterning process. "Same layer" does not always mean that the thickness of the layer or the height of the layer are the same in the cross-sectional view. "An orthographic projection of A contains an orthographic projection of B" means that the orthographic projection of B falls within the scope of the orthographic projection of A, or the orthographic projection of A covers the orthographic projection of B.

In some exemplary embodiments, the manufacturing process of the display substrate may include the following acts.

(1) A substrate is provided, and a pattern of a first conductive layer pattern is formed on the substrate.

In some exemplary embodiments, a first metal thin film is deposited on the substrate, and the first metal thin film is patterned through a patterning process to form a pattern of a first conductive layer. As shown in FIGS. 2 and 9, the pattern of the first conductive layer pattern at least includes a gate electrode of a thin film transistor of a drive circuit in a display region, a gate electrode of a transistor of a GOA unit in a peripheral region, a first part and a second part of an STV signal line 21, a ground lead 24, second common electrode lead 23, a signal transmission line group 25, a first capacitor electrode 26 of the first capacitor, and base electrode layers of a first ESD unit and a second ESD unit. The first capacitor electrode 261 of the first capacitor and the STV signal line 21 may have an integral structure.

(2) A pattern of a second conductive layer is formed on the substrate on which the aforementioned pattern is formed.

In some exemplary embodiments, a first insulator thin film and a semiconductor thin film are sequentially deposited on the substrate on which the aforementioned pattern is formed, and the semiconductor thin film is patterned through a patterning process to form a first insulator layer and a pattern of the semiconductor thin film disposed on the first insulator layer. Then a second metal thin film is deposited, and the second metal thin film is patterned through a patterning process to form a pattern of a second conductive layer. As shown in FIG. 6, the pattern of the semiconductor layer at least includes: the active layer of the thin film transistor of the drive circuit in the display region, and the first semiconductor region 291 and the second semiconductor region 292 of the first and second ESD units in the peripheral region. As shown in FIG. 4 and FIG. 6, the pattern of the second conductive layer at least includes a source-drain electrode of the thin film transistor of the drive circuit in the display region, a first switching electrode 213 of the switching unit 210 of the STV signal line 21 in the peripheral region, and a bonding electrode layers of the first ESD unit and the second ESD unit.

(3) A pattern of a second insulator layer provided with via is formed on the substrate on which the aforementioned patterns are formed.

In some exemplary embodiments, a second insulator thin film is deposited on the substrate on which the aforementioned patterns are formed, and the second insulator thin film is patterned through a patterning process to form a pattern of a second insulator layer provided with a plurality of vias. As shown in FIG. 4 and FIG. 7, the plurality of vias include, for example, a via exposing the surface of the drain electrode in the display region, a via exposing the surface of the first switching electrode 213 in the peripheral region, a via exposing the first and second parts of the STV signal line 21 in the peripheral region, a via exposing part of the electrode surfaces of the bonding electrode layers of the first and second ESD units, and a via exposing part of the electrode surfaces of the base electrode layers of the first and second ESD units. However, this is not limited in the present embodiment.

(4) A pattern of a third conductive layer is formed on the substrate on which the aforementioned pattern is formed.

In some exemplary embodiments, a transparent conductive thin film is deposited on the substrate on which the aforementioned patterns are formed, and the transparent conductive thin film is patterned through a patterning process to form a pattern of a third conductive layer. As shown in FIG. 2, FIG. 4, FIG. 6 and FIG. 9, the pattern of the third conductive layer at least includes a pixel electrode in the display region, a second switching electrode and a third switching electrode 214 and 215 of a switching unit 210 of the STV signal line 21 in the peripheral region, second common electrode lead 22, a second capacitor electrode 262 of the first capacitor, and a connection electrode layer of the first ESD unit and the second ESD unit. The second capacitor electrode 262 of the first capacitor and the second common electrode lead 22 may have an integral structure. The second common electrode lead 23 is connected to the first common electrode lead 22. The first common electrode lead 22 is connected to the ground lead 24 through the second ESD unit. The second common electrode lead 22 is connected to the STV signal line 21 through at least one first ESD unit.

In some exemplary embodiments, the substrate 200 may adopt a glass substrate, a quartz substrate, a plastic substrate, or a flexible substrate. The first metal thin film and the second metal thin film may adopt metals such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb) and the films can be of single-layered structure or multi-layered composite structure, for example Ti/Al/Ti etc. The active layer thin film is made of one or more of amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene, etc. The transparent conductive thin film may be made of indium tin oxide (ITO) or indium zinc oxide (IZO) and the like. The first insulator thin film and the second insulator thin film may be made of silicon oxide (SiOx), silicon nitride (SiNx), silicon oxynitride (SiON), etc., or aluminum oxide (AlOx), hafnium oxide (HfOx), tantalum oxide (TaOx), etc., and may be a single layer, a plurality of layers, or a composite layer. Generally, the first insulator layer 201 is referred to as a gate insulator (GI) layer, and the second insulator layer 202 is referred to as a passivation (PVX) layer.

The description of the structure and manufacturing process of the display substrate according to the present embodiments is merely illustrative. In some exemplary embodiment, according to actual needs, corresponding structures may be changed and patterning processes may be added or reduced. For example, a third insulator layer and a fourth conductive layer may be formed on a side of the third conductive layer away from the substrate, and the first common electrode lead may are of the same layer structure as the fourth conductive layer. However, this is not limited in the present embodiment.

In the display substrate provided in this exemplary embodiment, a first capacitor connecting the STV signal line and the first common electrode lead is provided to guide a large amount of charges accumulated in the STV signal line. Moreover, the STV signal line is connected to the GOA unit after passing through the switching unit, which can prevent a large amount of static electricity from entering the GOA unit. Furthermore, the STV signal line and the first common electrode lead are both connected to the first ESD unit to achieve electro-static discharge. And the second common electrode lead is connected to the ground lead through the second ESD unit to achieve electro-static discharge. In this embodiment, by providing various electro-static discharge paths, a large amount of static electricity can be prevented from destroying STV signal lines.

The preparation process of the display substrate of this exemplary embodiment is achieved by using the existing mature preparation equipment, which may be well compatible with the existing preparation process, and has advantages of simple process realization, easy implementation, high production efficiency, low production cost and high yield rate.

At least one embodiment of the present disclosure also provides a method for preparing a display substrate, which includes forming a GOA circuit, a first common electrode lead, a first capacitor and at least one ESD unit in the peripheral region of the substrate. The GOA circuit includes a plurality of GOA units and STV signal lines electrically connected to at least one GOA unit. The first common electrode lead is connected to the STV signal line through at least one first ESD unit. A first capacitor electrode of the first capacitor is connected to the STV signal line, and a second capacitor electrode of the first capacitor is connected to the first common electrode lead.

In some exemplary embodiments, forming of a GOA circuit, a first common electrode lead, a first capacitor and at least one ESD unit in a peripheral region of a substrate includes: forming a first insulator layer in the peripheral region of the substrate; sequentially forming a first insulator layer, a semiconductor layer and a second conductive layer on a side of the first conductive layer away from the substrate; sequentially forming a second insulator layer and a third conductive layer on a side of the second conductive layer away from the substrate. The first conductive layer at least includes an STV signal line, a first capacitor electrode of a first capacitor, a gate electrode of a transistor of a GOA circuit, and a base electrode layer of a first ESD unit. A basic electrode layer at least includes a first basic electrode, a second basic electrode and a third basic electrode. A semiconductor layer at least includes an active layer of a transistor of a GOA circuit, a first semiconductor region and a second semiconductor region of a first ESD unit. A second conductive layer at least includes: a source-drain electrode of the transistors of the GIA circuit, and a bonding electrode layer of the first ESD unit. A connection electrode layer at least includes a first bonding electrode, a second bonding electrode, a third bonding electrode and a fourth bonding electrode. A third conductive layer at least includes a first common electrode lead, a second capacitor electrode of a first capacitor and a connection electrode layer of a first ESD unit. A connection electrode layer at least includes a first connection electrode, a second connection electrode, a third connection electrode and a fourth connection electrode. The first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode. A first semiconductor region is disposed between the first bonding electrode and the second bonding electrode, and a second semiconductor region is disposed between the third bonding electrode and the fourth bonding electrode.

The preparation process of the aforementioned display substrate has been described in detail in the previous embodiments and will not be repeated here.

Figure 10:
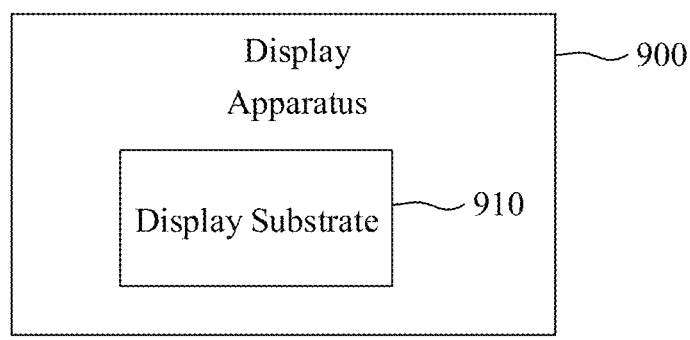
FIG. 10 is a schematic diagram of a display apparatus according to at least one embodiment of the present disclosure.

FIG. 10 is a schematic diagram of a display apparatus according to at least one embodiment of the present disclosure. As shown in FIG. 10, this embodiment provides a display apparatus 91, which includes a display substrate 910. The display substrate 910 is the display substrate provided in the previous embodiments. For example, the display apparatus may include an LCD display panel, which may include an array substrate and a color filter substrate which are oppositely disposed, and a liquid crystal layer filled between the array substrate and the color filter substrate. The array substrate may be the display substrate provided in the above embodiments. In some examples, the LCD display panel according to the embodiment may be a Fringe Field Switching (FFS) type or an Advanced-Super Dimension Switching (AD-SDS) type LCD display panel, in which the pixel electrode and the common electrode are both disposed on the array substrate in different layers. Or, in some examples, the LCD display panel according to the embodiment may be an In-Plane Switching (IPS) LCD display panel, in which the pixel electrodes and the common electrodes are both disposed on the array substrate and on the same layer. Or, in some examples, the LCD display panel according to the embodiment may be a Twisted Nematic (TN) type LCD display panel, in which the pixel electrodes are disposed on the array substrate and the common electrodes are disposed on the color filter substrate. However, this is not limited in the present embodiment.

In some examples, the display apparatus 91 may be any product or component with a display function such as an LCD display panel, a mobile phone, a tablet computer, a television, a display, a notebook computer, a digital photo frame, a navigator, etc. However, this is not limited in the present embodiment.

The drawings in the present disclosure only refer to the structures involved in the present disclosure, and common designs may be referred to for other structures. The embodiments of the present disclosure and the features in the embodiments may be combined with each other to obtain a new embodiment if there is no conflict.

Those of ordinary skills in the art should understand that modifications or equivalent substitutions may be made to the technical solutions of the present disclosure without departing from the essence and scope of the technical solutions of the present disclosure, all of which should be included within the scope of the claims of the present disclosure.

What is claimed is:

1. A display substrate, comprising: a substrate, wherein
the substrate comprises a display region and a peripheral region located at the periphery of the display region; wherein
the peripheral region is provided with a gate driver on array circuit, a first common electrode lead, a first capacitor and at least one first electro-static discharge unit;
the gate driver on array circuit comprises a plurality of gate driver on array units and STV signal lines electrically connected to at least one gate driver on array unit;
the first common electrode lead is connected to the STV signal line through the at least one first electro-static discharge unit; and
a first capacitor electrode of the first capacitor is connected to the STV signal line, and a second capacitor electrode of the first capacitor is connected to the first common electrode lead,
wherein the first electro-static discharge unit comprises a base electrode layer disposed on a substrate, a first insulator layer covering the base electrode layer, an bonding electrode layer disposed on the first insulator layer, a second insulator layer covering the bonding electrode layer, and a connection electrode layer disposed on the second insulator layer;
the basic electrode layer comprises a first basic electrode, a second basic electrode and a third basic electrode which are disposed on the substrate;
the bonding electrode layer comprises a first bonding electrode, a second bonding electrode, a third bonding electrode and a fourth bonding electrode which are disposed on the first insulator layer;
the connection electrode layer comprises a first connection electrode, a second connection electrode, a third connection electrode and a fourth connection electrode which are disposed on the second insulator layer;
the first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode;
a first semiconductor region is disposed between the first bonding electrode and the second bonding electrode, and a second semiconductor region is disposed between the third bonding electrode and the fourth bonding electrode; and
the first connection electrode is connected to the first common electrode lead or the STV signal line, and the fourth connection electrodes of two adjacent first electro-static discharge units are connected through electro-static discharge connection lines.

2. The display substrate according to claim 1, wherein the peripheral region is further provided with a second common electrode lead,
the second common electrode lead is in the same layer structure as the STV signal line,
the first common electrode lead is located on a side of the second common electrode lead away from the substrate, and
the first common electrode lead is electrically connected to the second common electrode lead.

3. The display substrate according to claim 2, wherein the peripheral region is further provided with a ground lead and a second electro-static discharge unit, and
the second common electrode lead is connected to the ground lead through the second electro-static discharge unit.

4. The display substrate according to claim 1, wherein the first capacitor electrode of the first capacitor and the STV signal line have an integral structure.

5. The display substrate according to claim 1, wherein the second capacitor electrode of the first capacitor is S-shaped.

6. The display substrate according to claim 1, wherein the first common electrode lead and a pixel electrode of the display region are of the same layer structure.

7. The display substrate according to claim 1, wherein
the STV signal line comprises a first part, a second part and a switching unit connected between the first part and the second part;
the switching unit comprises a first switching electrode, a second switching electrode and a third switching electrode;
the second switching electrode connects the first switching electrode and the first part, and the third switching electrode connects the first switching electrode and the second part; and
the first part and the second part are of the same layer structure, the second switching electrode and the third switching electrode are of the same layer structure, the first switching electrode is located on a side of the first and second parts away from the substrate, and the second and third switching electrodes are located on a side of the first switching electrode away from the substrate.

8. The display substrate according to claim 7, wherein the second switching electrode and the third switching electrode are of the same layer structure as a pixel electrode of the display region.

9. The display substrate according to claim 7, wherein a first part of the STV signal line is connected to a first capacitor electrode of the first capacitor, and a second part of the STV signal line is connected to the at least one gate driver on array unit; or, the second part of the STV signal line is connected to the first capacitor electrode of the first capacitor and the at least one gate driver on array unit.

10. A display apparatus, comprising the display substrate according to claim 1.

11. A method for preparing a display substrate, comprising:
forming a gate driver on array circuit, a first common electrode lead, a first capacitor and at least one first electro-static discharge unit in the peripheral region of the substrate; wherein
the gate driver on array circuit comprises a plurality of gate driver on array units and STV signal lines electrically connected to at least one gate driver on array unit;
the first common electrode lead is connected to the STV signal line through the at least one first electro-static discharge unit; and
a first capacitor electrode of the first capacitor is connected to the STV signal line, and a second capacitor electrode of the first capacitor is connected to the first common electrode lead, wherein the forming of the gate driver on array circuit, the first common electrode lead, the first capacitor and at least one electro-static discharge unit in the peripheral region of the substrate comprises:

forming a first conductive layer in the peripheral region of the substrate, wherein the first conductive layer at least comprises an STV signal line, a first capacitor electrode of a first capacitor, a gate electrode of a transistor of an gate driver on array circuit, and a basic electrode layer of a first electro-static discharge unit; the base electrode layer at least comprises a first base electrode, a second base electrode and a third base electrode;

sequentially forming a first insulator layer, a semiconductor layer and a second conductive layer on a side of the first conductive layer away from the substrate, wherein the semiconductor layer at least comprises an active layer of a transistor of an gate driver on array circuit, a first semiconductor region and a second semiconductor region of a first electro-static discharge unit; the second conductive layer at least comprises: a source-drain electrode of the transistors of the gate driver on array circuit, and a bonding electrode layer of the first electro-static discharge unit; the connection electrode layer at least comprises a first bonding electrode, a second bonding electrode, a third bonding electrode and a fourth bonding electrode; and sequentially forming a second insulator layer and a third conductive layer on a side of the second conductive layer away from the substrate, wherein the third conductive layer at least comprises a first common electrode lead, a second capacitor electrode of a first capacitor and a connection electrode layer of a first electro-static discharge unit; the connection electrode layer at least comprises a first connection electrode, a second connection electrode, a third connection electrode and a fourth connection electrode; wherein the first connection electrode is connected to the first base electrode and first bonding electrode, the second connection electrode is connected to the second base electrode and second bonding electrode, the third connection electrode is connected to the second base electrode and the third bonding electrode, and the fourth connection electrode is connected to the third base electrode and fourth bonding electrode; a first semiconductor region is disposed between the first bonding electrode and the second bonding electrode, and a second semiconductor region is disposed between the third bonding electrode and the fourth bonding electrode.

* * * * *